United States Patent
Sakanushi

(10) Patent No.: US 9,190,150 B2
(45) Date of Patent: Nov. 17, 2015

(54) NON-VOLATILE MEMORY DEVICE HAVING 3D MEMORY CELL ARRAY WITH IMPROVED WORDLINE AND CONTACT LAYOUT

(71) Applicant: Kabushiki Kaisha Toshiba, Minato-ku (JP)

(72) Inventor: Keishi Sakanushi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 136 days.

(21) Appl. No.: 14/017,435

(22) Filed: Sep. 4, 2013

(65) Prior Publication Data

US 2014/0293700 A1    Oct. 2, 2014

(30) Foreign Application Priority Data

Mar. 26, 2013   (JP) ................ 2013-064629

(51) Int. Cl.
| | |
|---|---|
| *H01L 29/78* | (2006.01) |
| *G11C 16/04* | (2006.01) |
| *H01L 27/115* | (2006.01) |
| *H01L 29/792* | (2006.01) |

(52) U.S. Cl.
CPC ........ *G11C 16/0483* (2013.01); *H01L 27/1157* (2013.01); *H01L 27/11573* (2013.01); *H01L 27/11575* (2013.01); *H01L 27/11582* (2013.01); *H01L 29/7926* (2013.01); *H01L 27/11578* (2013.01)

(58) Field of Classification Search
CPC .............. H01L 27/11582; H01L 27/11578; H01L 29/7926; H01L 27/11573; H01L 27/11575; H01L 27/1157; G11C 16/0483

USPC ........ 365/185.17, 51, 63; 257/326, E27.103, 257/E29.309

See application file for complete search history.

(56) References Cited

U.S. PATENT DOCUMENTS

| | | | |
|---|---|---|---|
| 7,643,345 B2 | 1/2010 | Ishibashi | |
| 8,148,769 B2 * | 4/2012 | Kito et al. | ...... 257/321 |
| 8,569,133 B2 * | 10/2013 | Kito et al. | ...... 438/268 |
| 8,704,288 B2 * | 4/2014 | Lee et al. | ...... 257/316 |
| 2011/0115010 A1 | 5/2011 | Shim et al. | |
| 2012/0119283 A1* | 5/2012 | Lee et al. | ...... 257/316 |

OTHER PUBLICATIONS

Office Action issued May 22, 2015 in Japanese Patent Application No. 2013-064629 (with English language translation).

* cited by examiner

*Primary Examiner* — Son Dinh
*Assistant Examiner* — Xiaochun L Chen
(74) *Attorney, Agent, or Firm* — Oblon, McClelland, Maier & Neustadt, L.L.P.

(57) ABSTRACT

According to one embodiment, a semiconductor memory device includes a semiconductor substrate, a memory cell array including a plurality of stacked memory cells, a plurality of first wirings electrically connected to the plurality of memory cells, a plurality of first contacts electrically connected to part of the plurality of first wirings and arranged in a first direction parallel to the semiconductor substrate, a plurality of second contacts electrically connected to part of the plurality of first wirings and arranged in the first direction alternately with the first contacts, a plurality of third contacts electrically connected to the first contacts and displaced from the first contacts in the first direction, and a plurality of fourth contacts electrically connected to the second contacts and displaced from the second contacts in a second direction perpendicular to the first direction.

15 Claims, 12 Drawing Sheets

NON-VOLATILE MEMORY DEVICE HAVING 3D MEMORY CELL ARRAY WITH IMPROVED WORDLINE AND CONTACT LAYOUT

CROSS-REFERENCE TO RELATED APPLICATIONS

This application is based upon and claims the benefit of priority from Japanese Patent Application No. 2013-064629, filed on Mar. 26, 2013; the entire contents of which are incorporated herein by reference.

FIELD

Embodiments described herein relate generally to a semiconductor memory device.

BACKGROUND

NAND flash memories with memory cells three-dimensionally arranged therein have been known.

DETAILED DESCRIPTION

Figure 1:
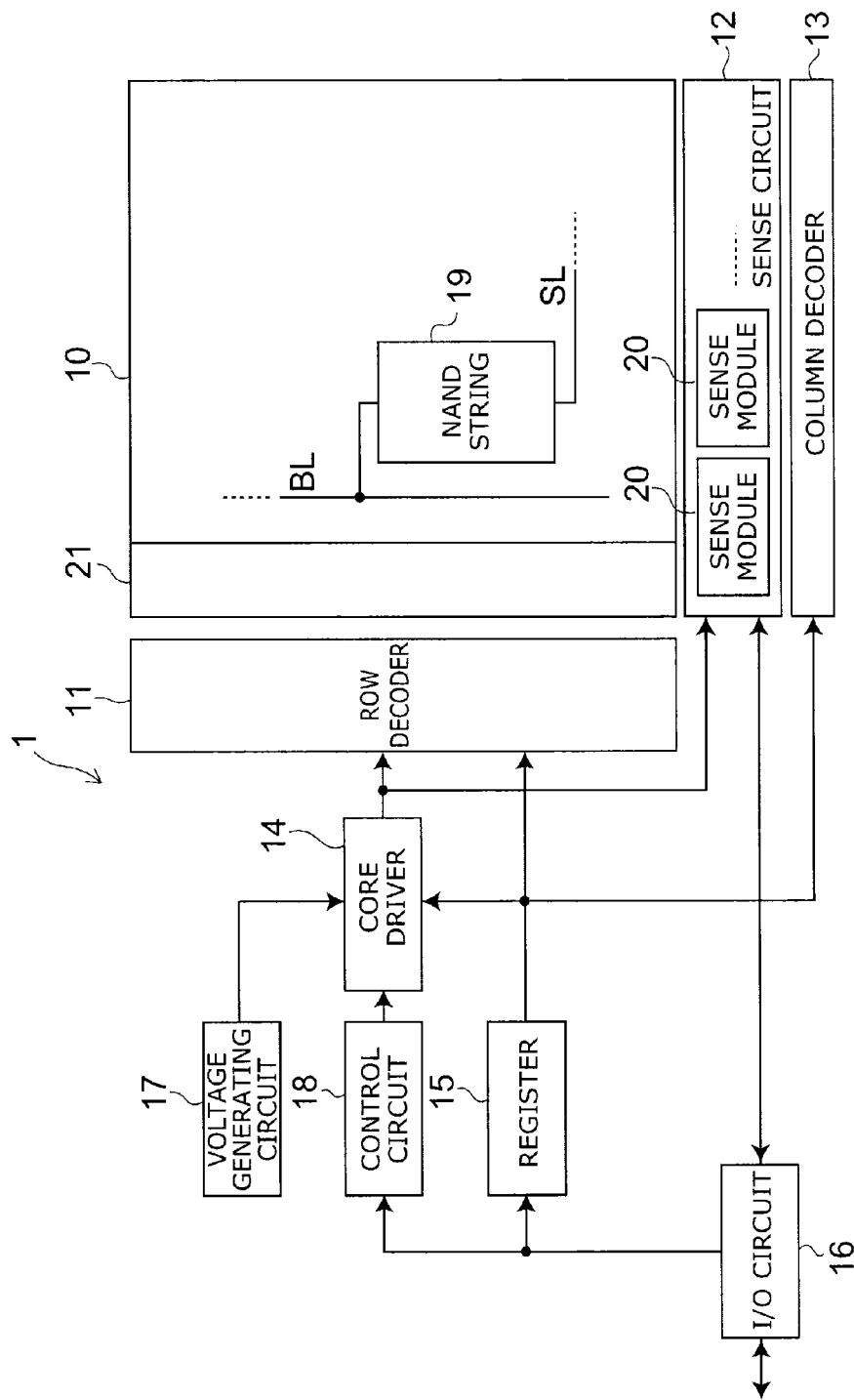
FIG. 1 is a block diagram of a semiconductor memory device according to a first embodiment.

In general, according to one embodiment, a semiconductor memory device includes a semiconductor substrate, a memory cell array including a plurality of stacked memory cells, a plurality of first wirings electrically connected to the plurality of memory cells, a plurality of first contacts electrically connected to part of the plurality of first wirings and arranged in a first direction parallel to the semiconductor substrate, a plurality of second contacts electrically connected to part of the plurality of first wirings and arranged in the first direction alternately with the first contacts, a plurality of third contacts electrically connected to the first contacts and displaced from the first contacts in the first direction, and a plurality of fourth contacts electrically connected to the second contacts and displaced from the second contacts in a second direction perpendicular to the first direction.

Embodiments will now be described with reference to the drawings. In this description, throughout the drawings, like portions are labeled with like reference numerals.

1. First Embodiment

A semiconductor memory device according to a first embodiment is now described. In the following description of the semiconductor memory device, a three-dimensionally stacked NAND flash memory with memory cells stacked on a semiconductor substrate is taken as an example.

1.1 Configuration of the Semiconductor Memory Device

First, the configuration of the semiconductor memory device according to this embodiment is described.

1.1.1 Overall Configuration of the Semiconductor Memory Device

FIG. 1 is a block diagram of a NAND flash memory according to this embodiment. As shown, the NAND flash memory 1 includes a memory cell array 10, a row decoder 11, a sense circuit 12, a column decoder 13, a core driver 14, a register 15, an input/output circuit 16, a voltage generating circuit 17, and a control circuit 18.

The memory cell array 10 includes a plurality of NAND strings 19 in which nonvolatile memory cells are series connected. A word line (not shown) is connected to the gate of the memory cell in the NAND string 19. A bit line BL is connected to the drain of the memory cell at one end of the NAND string 19. A source line SL is connected to the source of the memory cell at the other end.

The row decoder 11 selects a row of the memory cell array 10. In other words, at the time of writing, reading, and erasing data, the row decoder 11 selects one word line, and applies a required voltage to a selected word line and non-selected word lines. A contact region 21 is formed between the memory cell array 10 and the row decoder 11. This contact region 21 has the function of connecting the word lines to the overlying wirings to connect a plurality of word lines of the memory cell array 10 to a plurality of transfer transistors (not shown) of the row decoder 11. A detailed layout will be described later.

The sense circuit 12 includes sense modules 20 provided corresponding to the bit lines BL. At the time of reading data, the sense module 20 senses and amplifies data read from the bit line BL. At the time of writing data, the sense module 20 transfers write data to the bit line BL.

The column decoder 13 selects a column of the memory cell array 10. In other words, at the time of transferring write data and read data, the column decoder 13 selects one sense module 20.

The voltage generating circuit 17 generates a voltage required to write, read, and erase data in response to a command of e.g. the control circuit 18. The voltage generating circuit 17 supplies this voltage to the core driver 14.

The core driver 14 supplies the row decoder 11 and the sense circuit 12 with a required voltage of the voltages supplied from the voltage generating circuit 17 in response to a command of e.g. the control circuit 18. Then, the voltage supplied from the core driver 14 is applied to the word line by the row decoder 11, and applied to the bit line by the sense circuit 12.

The input/output circuit 16 controls input/output of signals exchanged with a controller or host device accessing the NAND flash memory 1.

The register 15 retains commands, addresses and the like received from the controller or host device. Then, for instance, the register 15 transfers a row address to the row decoder 11 and the core driver 14, and transfers a column address to the column decoder 13.

The control circuit 18 controls the operation of the entire NAND flash memory 1 in accordance with the command received from the host device. Various control signals in the following description are generated by e.g. the control circuit 18.

1.1.2 Memory Cell Array 10

Figure 2:
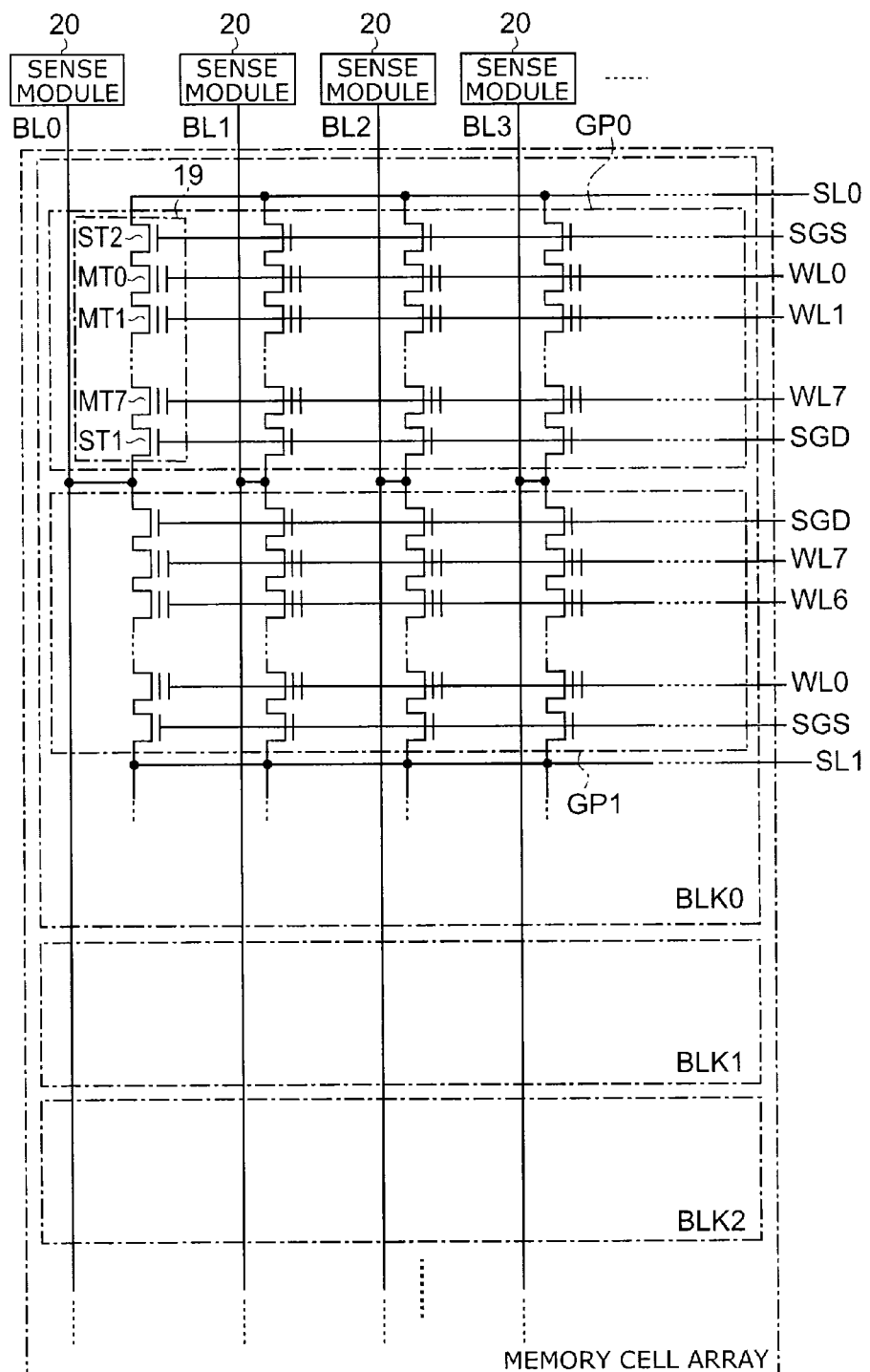
FIG. 2 is a block diagram of a memory cell array and a sense amplifier according to the first embodiment.

Next, the configuration of the above memory cell array 10 is described in detail. FIG. 2 is a circuit diagram of the memory cell array 10.

As shown, the memory cell array includes a plurality of NAND strings 19 arranged in a matrix. Each of the NAND strings 19 includes e.g. eight memory cell transistors MT (MT0-MT7) and select transistors ST1, ST2. The memory cell transistor MT includes a stacked gate including a control gate and a charge accumulation layer, and retains data in a nonvolatile manner. Here, the number of memory cell transistors MT is not limited to 8, but may be 16, 32, 64, 128 and the like. The memory cell transistors MT are arranged between the select transistors ST1, ST2 so that their current paths are series connected. The current path of the memory cell transistor MT7 at one end of this series connection is connected to one end of the current path of the select transistor ST1. The current path of the memory cell transistor MT0 at the other end is connected to one end of the current path of the select transistor ST2.

The control gates of the memory cell transistors MT located on the same row are commonly connected to one of the word lines WL (WL0-WL7). The gates of the select transistors ST1, ST2 of the NAND strings 19 located on the same row are commonly connected to select gate lines SGD, SGS, respectively.

The other end of the current path of the select transistors ST1 located on the same column in the memory cell array 10 is commonly connected to one of the bit lines BL (BL0, BL1, . . . ). Furthermore, the other end of the current path of the select transistors ST2 is commonly connected to the source line SL (SL0, SL1, . . . ).

In the following, the set of a plurality of NAND strings 19 arranged on the same row is referred to as memory group GP (GP0, GP1, . . . ). In the memory cell array 10, a plurality of memory groups GP are arranged in the direction along the bit line. In the same memory group GP, a plurality of NAND strings 19 have common select gate lines SGD, SGS. However, in different memory groups GP, the NAND strings 19 are connected to different select gate lines SGD, SGS. Thus, reading and writing of data are performed in units of a plurality of memory cell transistors connected to one word line WL in one memory group GP. This unit is referred to as "page". Furthermore, erasing of data is performed in units of a plurality of memory groups GP. This unit is referred to as "block". In the same block, even in different memory groups GP, e.g. word lines WL are commonly connected. That is, in the same block, the word line WL0 belonging to one memory group GP and the word line WL0 belonging to another memory group GP are commonly connected. The same also applies to the other word lines. Furthermore, a plurality of memory groups GP may share the same source line SL, or may be connected to mutually different source lines SL.

Figure 3:
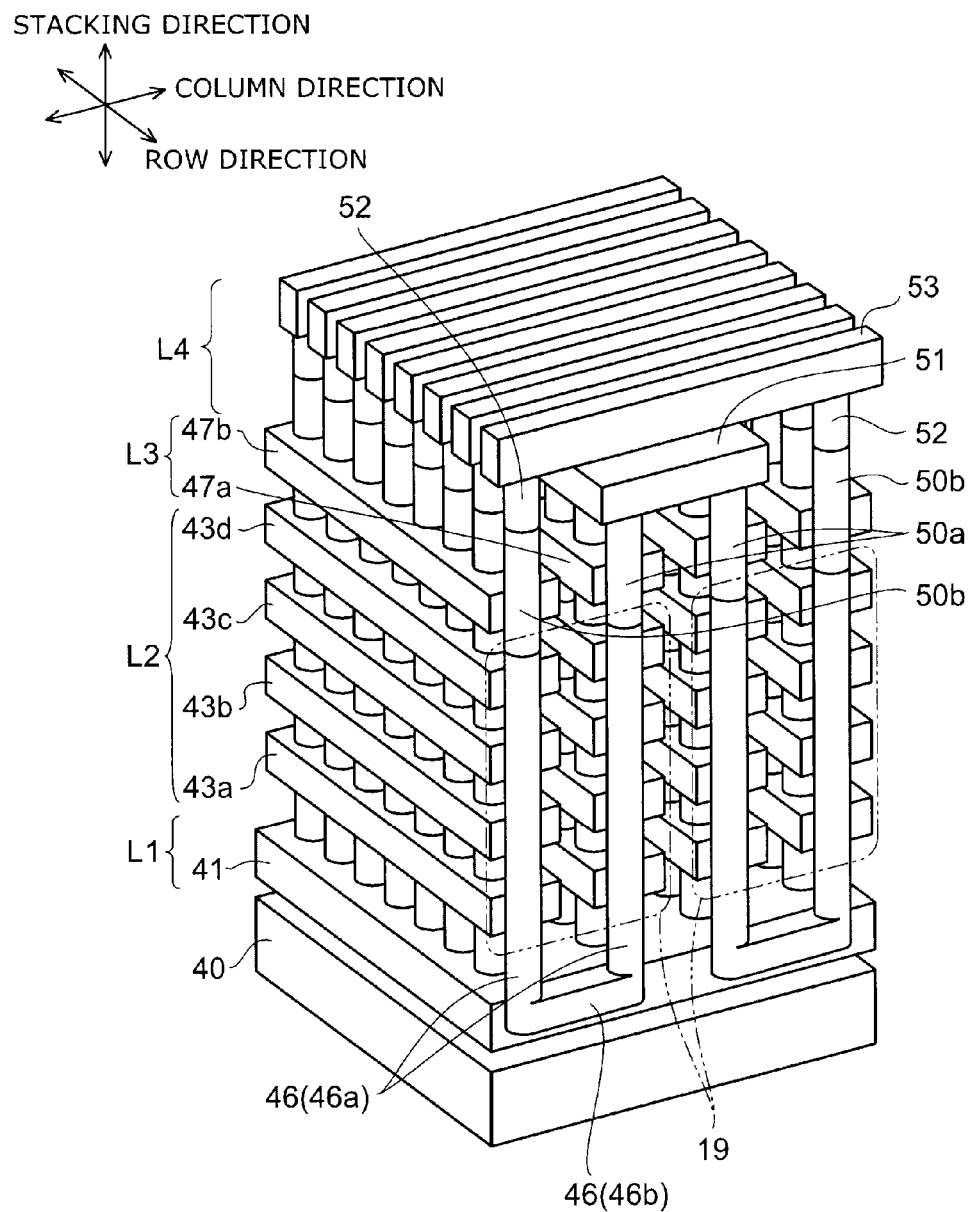
FIG. 3 is a perspective view of the memory cell array according to the first embodiment.
Figure 4:
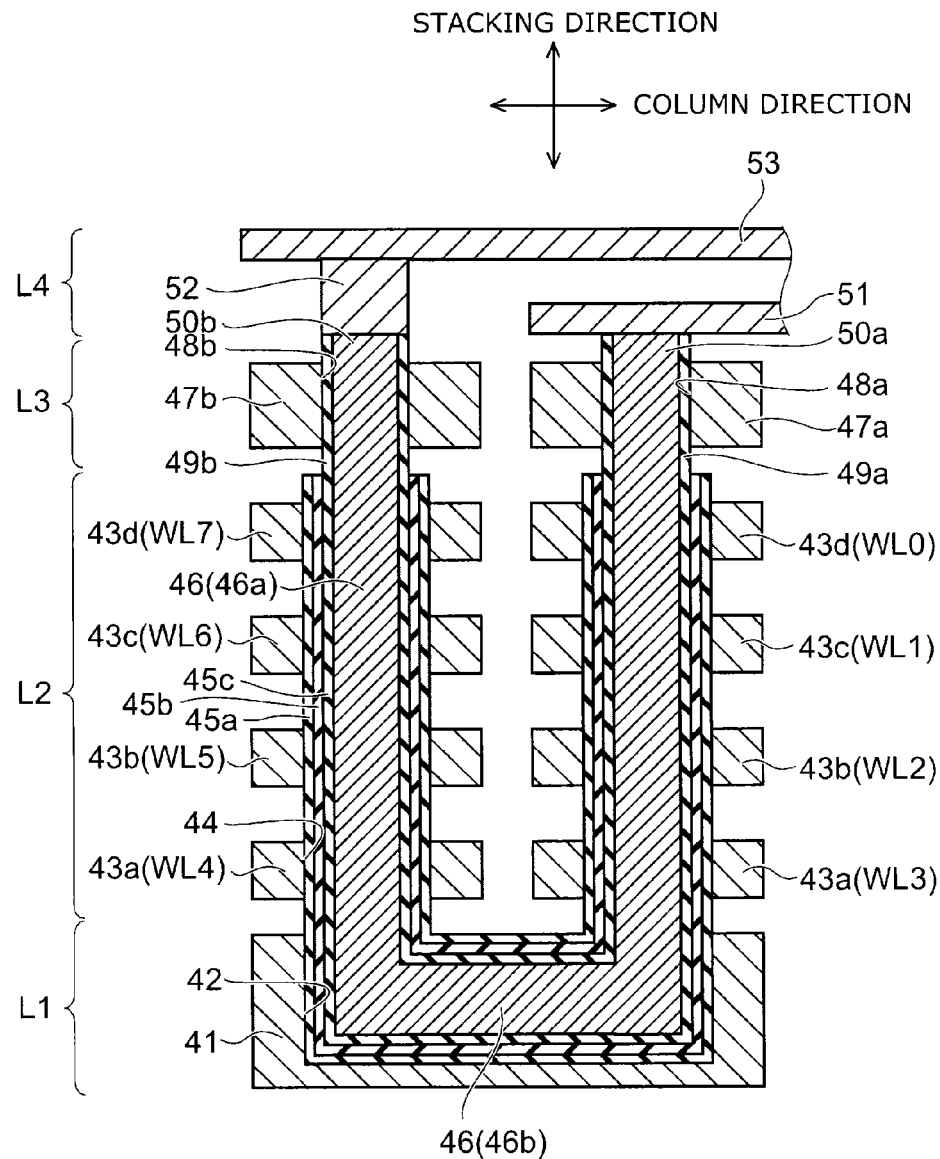
FIG. 4 is a sectional view of the memory cell array according to the first embodiment.

Next, the three-dimensional stacked structure of the memory cell array 10 is described with reference to FIGS. 3 and 4. FIGS. 3 and 4 are a perspective view and a sectional view of the memory cell array 10.

As shown, the memory cell array 10 is provided on a semiconductor substrate 40. The memory cell array 10 includes a back gate transistor layer L1, a memory cell transistor layer L2, a select transistor layer L3, and a wiring layer L4 sequentially formed on the semiconductor substrate 40.

The back gate transistor layer L1 functions as a back gate transistor BT. The memory cell transistor layer L2 functions as memory cell transistors MT0-MT7 (NAND string 19). The select transistor layer L3 functions as select transistors ST1, ST2. The wiring layer L4 functions as s source line SL and a bit line BL.

The back gate transistor layer L1 includes a back gate conductive layer 41. The back gate conductive layer 41 is formed so as to spread two-dimensionally in the row direction and the column direction parallel to the semiconductor substrate 40. The back gate conductive layer 41 is divided for each memory block. The memory block is a set of memory groups GP and constitutes a unit of erasing data. The back gate conductive layer 41 is formed from e.g. polycrystalline silicon. The back gate conductive layer 41 functions as a back gate line BG.

As shown in FIG. 4, the back gate conductive layer 41 includes a back gate hole 42. The back gate hole 42 is formed so as to dig into the back gate conductive layer 41. The back gate hole 42 is formed in a generally rectangular shape with the longitudinal direction directed in the column direction as viewed from above.

The memory cell transistor layer L2 is formed above the back gate transistor layer L1. The memory cell transistor layer L2 includes word line conductive layers 43a-43d. The word line conductive layers 43a-43d are stacked via interlayer insulating layers (not shown). The word line conductive layers 43a-43d are formed like stripes extending in the row direction with a prescribed pitch in the column direction. The word line conductive layers 43a-43d are formed from e.g. polycrystalline silicon. The word line conductive layer 43a functions as control gates (word lines WL3, WL4) of the memory cell transistors MT3, MT4. The word line conductive layer 43b functions as control gates (word lines WL2, WL5) of the memory cell transistors MT2, MT5. The word line conductive layer 43c functions as control gates (word lines WL1, WL6) of the memory cell transistors MT1, MT6. The word line conductive layer 43d functions as control gates (word lines WL0, WL7) of the memory cell transistors MT0, MT7.

As shown in FIG. 4, the memory cell transistor layer L2 includes a memory hole 44. The memory hole 44 is formed so as to penetrate through the word line conductive layers 43a-43d. The memory hole 44 is formed in alignment with the neighborhood of the end portion in the column direction of the back gate hole 42.

Furthermore, as shown in FIG. 4, the back gate transistor layer L1 and the memory cell transistor layer L2 include a block insulating layer 45a, a charge accumulation layer 45b, a tunnel insulating layer 45c, and a semiconductor layer 46. The semiconductor layer 46 functions as a body (back gate of each transistor) of the NAND string 19.

As shown in FIG. 4, the block insulating layer 45a is formed with a prescribed thickness on the sidewall facing the back gate hole 42 and the memory hole 44. The charge accumulation layer 45b is formed with a prescribed thickness on the side surface of the block insulating layer 45a. The tunnel insulating layer 45c is formed with a prescribed thickness on the side surface of the charge accumulation layer 45b. The semiconductor layer 46 is formed in contact with the side surface of the tunnel insulating layer 45c. The semiconductor layer 46 is formed so as to fill the back gate hole 42 and the memory hole 44.

The semiconductor layer 46 is formed in a U-shape as viewed in the row direction. That is, the semiconductor layer 46 includes a pair of columnar portions 46a extending in the direction perpendicular to the surface of the semiconductor substrate 40, and a linking portion 46b linking the lower ends of the pair of columnar portions 46a.

The block insulating layer 45a and the tunnel insulating layer 45c are formed from e.g. silicon oxide ($SiO_2$). The charge accumulation layer 45b is formed from e.g. silicon nitride (SiN). The semiconductor layer 46 is formed from polycrystalline silicon. The block insulating layer 45a, the charge accumulation layer 45b, the tunnel insulating layer 45c, and the semiconductor layer 46 form a MONOS transistor functioning as a memory cell transistor MT.

The above configuration of the back gate transistor layer L1 can be differently described as follows. The tunnel insulating layer 45c is formed so as to surround the linking portion 46b. The back gate conductive layer 41 is formed so as to surround the linking portion 46b.

The above configuration of the memory cell transistor layer L2 can be differently described as follows. The tunnel insulating layer 45c is formed so as to surround the columnar portion 46a. The charge accumulation layer 45b is formed so as to surround the tunnel insulating layer 45c. The block insulating layer 45a is formed so as to surround the charge accumulation layer 45b. The word line conductive layers 43a-43d are formed so as to surround the block insulating layer 45a-45c and the columnar portion 46a.

As shown in FIGS. 3 and 4, the select transistor layer L3 includes conductive layers 47a and 47b. The conductive layers 47a and 47b are formed like stripes extending in the row direction with a prescribed pitch in the column direction. A pair of conductive layers 47a and a pair of conductive layers 47b are alternately arranged in the column direction. The conductive layer 47a is formed above one columnar portion 46a, and the conductive layer 47b is formed above the other columnar portion 46a.

The conductive layers 47a and 47b are formed from polycrystalline silicon. The conductive layer 47a functions as a gate (select gate line SGS) of the select transistor ST2. The conductive layer 47b functions as a gate (select gate line SGD) of the select transistor ST1.

As shown in FIG. 4, the select transistor layer L3 includes holes 48a and 48b. The holes 48a and 48b penetrate through the conductive layers 47a and 47b, respectively. The holes 48a and 48b are each aligned with the memory hole 44.

As shown in FIG. 4, the select transistor layer L3 includes gate insulating layers 49a and 49b, and semiconductor layers 50a and 50b. The gate insulating layers 49a and 49b are formed on the sidewall facing the holes 48a and 48b, respectively. The semiconductor layers 50a and 50b are formed in columnar shape extending in the direction perpendicular to the surface of the semiconductor substrate 40 so as to be in contact with the gate insulating layers 49a and 49b, respectively.

The gate insulating layers 49a and 49b are formed from e.g. silicon oxide ($SiO_2$). The semiconductor layers 50a and 50b are formed from e.g. polycrystalline silicon.

The above configuration of the select transistor layer L3 can be differently described as follows. The gate insulating layer 49a is formed so as to surround the columnar semiconductor layer 50a. The conductive layer 47a is formed so as to surround the gate insulating layer 49a and the semiconductor layer 50a. Furthermore, the gate insulating layer 49b is formed so as to surround the columnar semiconductor layer 50b. The conductive layer 47b is formed so as to surround the gate insulating layer 49b and the semiconductor layer 50b.

As shown in FIGS. 3 and 4, the wiring layer L4 is formed above the select transistor layer L3. The wiring layer L4 includes a source line layer 51, a plug layer 52, and a bit line layer 53.

The source line layer 51 is formed like a plate extending in the row direction. The source line layer 51 is formed in contact with the upper surface of a pair of semiconductor layers 50a adjacent in the column direction. The plug layer 52 is formed in contact with the upper surface of the semiconductor layer 50b so as to extend in the direction perpendicular to the surface of the semiconductor substrate 40. The bit line layers 53 are formed like stripes extending in the column direction with a prescribed pitch in the row direction. The bit line layer 53 is formed in contact with the upper surface of the plug layer 52. The source line layer 51, the plug layer 52, and the bit line layer 53 are formed from a metal such as tungsten (W). The source line layer 51 functions as a source line SL described in FIGS. 1 and 2. The bit line layer 53 functions as a bit line BL.

Figure 5:
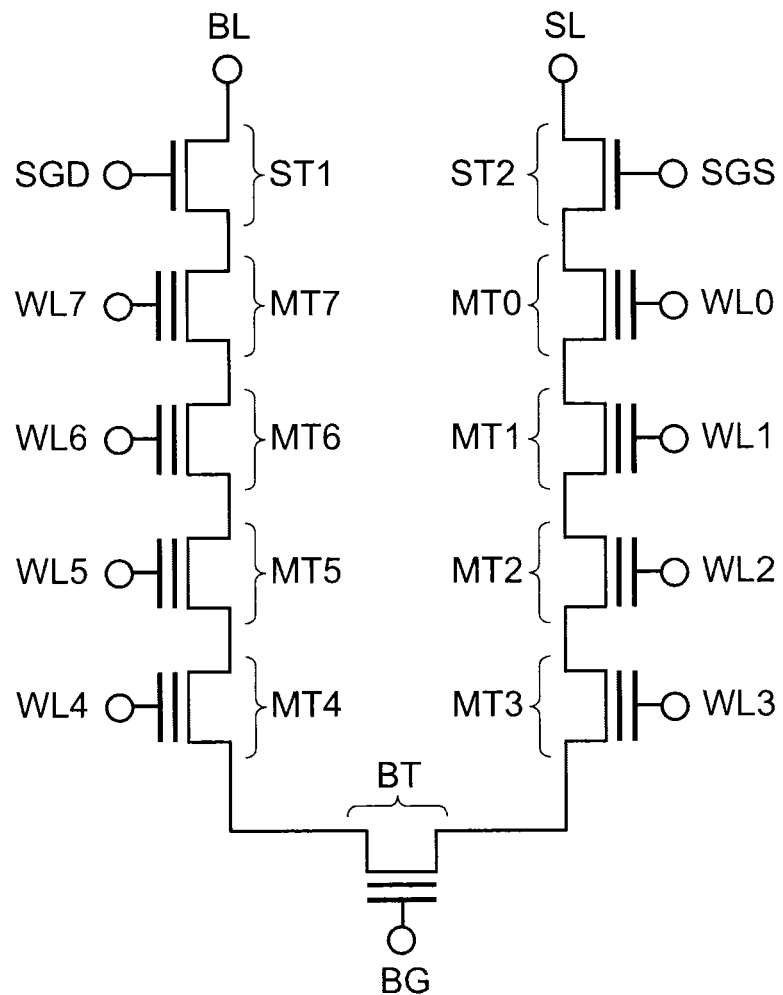
FIG. 5 is an equivalent circuit diagram of a NAND string according to the first embodiment.

An equivalent circuit of the NAND string 19 shown in FIGS. 3 and 4 is shown in FIG. 5. The configuration of FIG. 5 is equivalent to the configuration of the NAND string of FIG. 2. However, in FIG. 2, the back gate transistor BT is not shown.

As shown, the NAND string 19 includes select transistors ST1, ST2, memory cell transistors MT0-MT7, and a back gate transistor BT. As described above, the memory cell transistors MT are series connected between the select transistors ST1, ST2. The back gate transistor BT is series connected between the memory cell transistors MT3 and MT4.

The control gate of the memory cell transistor MT is connected to the word line WL. The control gate of the back gate transistor BT is connected to the back gate line BG. At the time of writing and reading data, the back gate transistor BT is always turned on. The set of a plurality of NAND strings 19 arranged along the row direction in FIG. 3 corresponds to the memory group GP described with reference to FIG. 2.

1.1.3 Contact Region 21

Next, the contact region 21 is described. As described with reference to FIG. 1, the contact region 21 has the function of connecting the word lines WL to the overlying wirings to connect a plurality of word lines WL of the memory cell array 10 to a plurality of transfer transistors of the row decoder 11.

Figure 6:
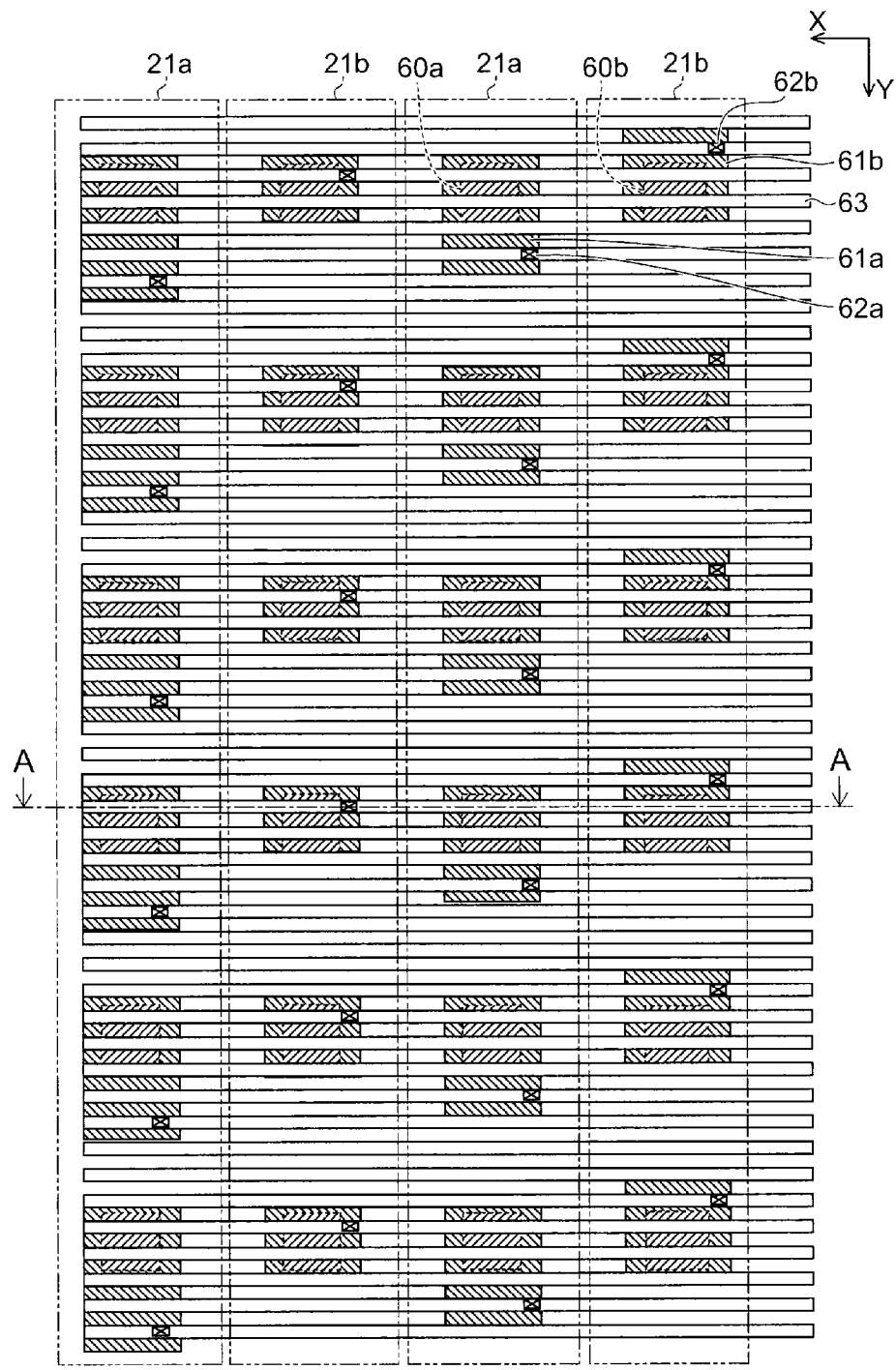
FIG. 6 is a top view showing the layout of a contact region according to the first embodiment.

As shown in the top view of FIG. 6, the contact region 21 includes a plurality of first regions 21a and a plurality of second regions 21b. The first regions 21a and the second regions 21b are alternately arranged in the X direction shown in FIG. 6.

For convenience of description, one first region 21a of the plurality of first regions 21a and one second region 21b of the plurality of second regions 21b are taken as an example to describe the contact region 21.

Figure 7:
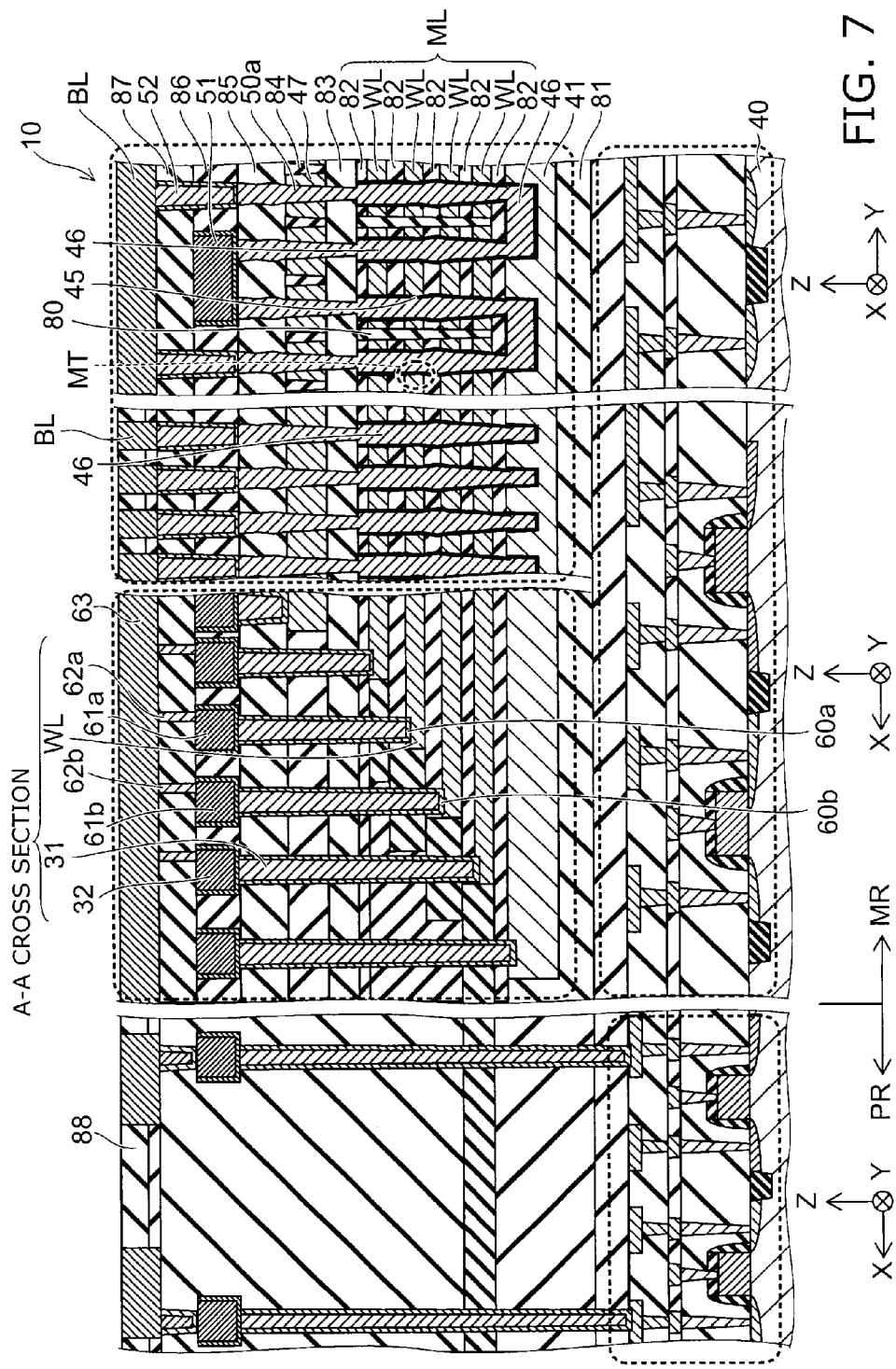
FIG. 7 is a sectional view taken along A-A of FIG. 6.

FIG. 7 is composed of a figure as viewed in the Y direction (left part of FIG. 7) and a figure as viewed in the X direction (right part of FIG. 7). As shown in FIG. 7, insulating layers 80-88 are embedded between the aforementioned wirings and contacts.

The first region 21a includes a plurality of first contacts 60a, a plurality of first wirings 61a, and a plurality of second contacts 62a.

The plurality of first contacts 60a are regularly arranged in the Y direction of FIG. 6. For instance, the plurality of first contacts 60a are arranged at equal spacing in the Y direction. The plurality of first contacts 60a are connected to the corresponding word lines WL. Furthermore, the plurality of first contacts 60a are connected to the plurality of first wirings 61a described later (see FIG. 7).

Like the first contacts 60a, the plurality of first wirings 61a are arranged in the Y direction of FIG. 6. The first wiring 61a has the function of connecting the first contact 60a and the second contact 62a described later. As viewed from above, the first wiring 61a is shaped like e.g. a rectangle extending in the Y direction. The shape of the first wiring 61a is not limited thereto, but may be any shape as long as the first contact 60a and the second contact 62a can be connected.

The plurality of second contacts 62a are regularly arranged in the Y direction of FIG. 6. For instance, the plurality of second contacts 62a are arranged at equal spacing in the Y direction. The plurality of second contacts 62a are connected to the corresponding first wirings 61a. The second contact 62a is formed with a displacement in the Y direction relative to the first contact 60a.

The plurality of second contacts 62a are connected to corresponding second wirings 63. Here, the second wiring 63 is an overlying wiring of the second contact 62a and is connected to the row decoder 11.

Next, the second region 21b is described with reference to FIGS. 6 and 7.

The second region 21b includes a plurality of third contacts 60b, a plurality of third wirings 61b, and a plurality of fourth contacts 62b.

The plurality of third contacts 60b are regularly arranged in the Y direction of FIG. 6. For instance, the plurality of third contacts 60b are arranged at equal spacing in the Y direction. The plurality of third contacts 60b are connected to the corresponding word lines WL. Furthermore, the plurality of third contacts 60b are connected to the plurality of third wirings 61b described later (see FIG. 7).

Like the third contacts 60b, the plurality of third wirings 61b are arranged in the Y direction of FIG. 6. The third wiring 61b has the function of connecting the third contact 60b and the fourth contact 62b described later. As viewed from above, the third wiring 61b is shaped like e.g. a rectangle extending in the X direction. The shape of the third wiring 61b is not limited thereto, but may be any shape as long as the third contact 60b and the fourth contact 62b can be connected.

The plurality of fourth contacts 62b are regularly arranged in the Y direction of FIG. 6. For instance, the plurality of fourth contacts 62b are arranged at equal spacing in the Y direction. The plurality of fourth contacts 62b are connected to the corresponding third wirings 61b. The fourth contact 62b is formed with a displacement in the X direction relative to the third contact 60b.

The plurality of second contacts 62a and the plurality of fourth contacts 62b as a whole are regularly arranged obliquely to the Y direction. Each of the plurality of fourth contacts 62b is connected to the corresponding second wiring 63.

The upper portion of the first contact 60a and the upper portion of the third contact 60b are located in the same insulating layer 85. The first wiring 61a and the third wiring 61b are located in the same insulating layer 86. The second contact 62a and the fourth contact 62b are located in the same insulating layer 87. The second wiring 63 is located in the insulating layer 88. Furthermore, the layer with the upper portion of the first contact 60a and the upper portion of the third contact 60b provided in the insulating layer 85, the layer with the first wiring 61a and the third wiring 61b provided in the insulating layer 86, the layer with the second contact 62a and the fourth contact 62b provided in the insulating layer 87, and the layer with the second wiring 63 provided in the insulating layer 88 are stacked in this order from bottom to top.

1.2 Effect of the First Embodiment

The configuration according to this embodiment can provide a semiconductor memory device capable of reducing the contact region. This effect is described below.

Figure 8:
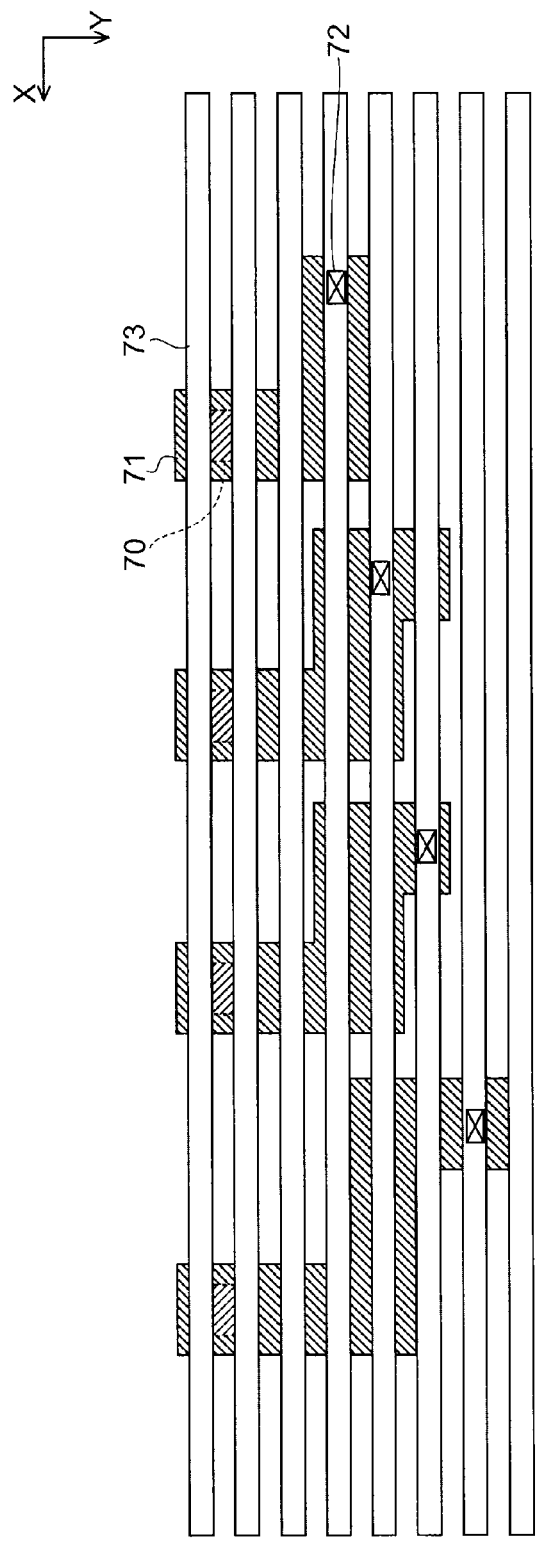
FIG. 8 is a top view showing the layout of a contact region according to a comparative example.

A comparative example is described with reference to the top view of FIG. 8. FIG. 8 is a top view showing the layout of a contact region according to the comparative example.

The contact region of the comparative example includes a plurality of contacts 70 connected to a plurality of word lines WL, a plurality of wirings 71 respectively connected to the plurality of contacts 70, and a plurality of contacts 72 respectively connected to the plurality of wirings 71. The plurality of contacts 72 are connected to a plurality of wirings 73. To facilitate lithography, the plurality of contacts 72 may be regularly arranged. Then, as shown in FIG. 8, the shape of the plurality of wirings 71 is bent at one or more locations. Such a shape of the wiring 71 makes lithography difficult.

However, in the semiconductor memory device according to this embodiment, the second contact 62a is formed with a displacement in the Y direction relative to the first contact 60a. Furthermore, the fourth contact 62b is formed with a displacement in the X direction relative to the third contact 60b. The second contacts 62a and the fourth contacts 62b are alternately arranged in the X direction. Thus, the shape of the first wiring 61a and the third wiring 61b is not bent at one or more locations. This can facilitate lithography of the first wiring 61a and the third wiring 61b.

The second contact 62a and the fourth contact 62b are formed with a displacement in the Y direction or X direction relative to the first contact 60a and the third contact 60b. Thus, for instance, the fourth contact 62b can be placed within the total width of the width in the Y direction of the third contact 60b itself and the width of a space between the third contacts 60b. The space is requested in the case that the third contacts 60b are arranged along the Y direction. Accordingly, providing the fourth contact 62b requests no increase of the arrangement period of the third contacts 60b in the Y direction and causes no area penalty in the Y direction. Thus, this embodiment can make the area of the contact region of the semiconductor memory device smaller than the comparative example.

Furthermore, in the semiconductor memory device of this embodiment, as shown in FIG. 6, the order of the second wirings 63 arranged in the Y direction does not need to be matched with the order of the first contacts 60a and the third contacts 60b arranged in the X direction. The arrangement of the second contacts 62a and the fourth contacts 62b can be adapted to connect each word line WL to an arbitrary second wiring 63.

2. Second Embodiment

Figure 9:
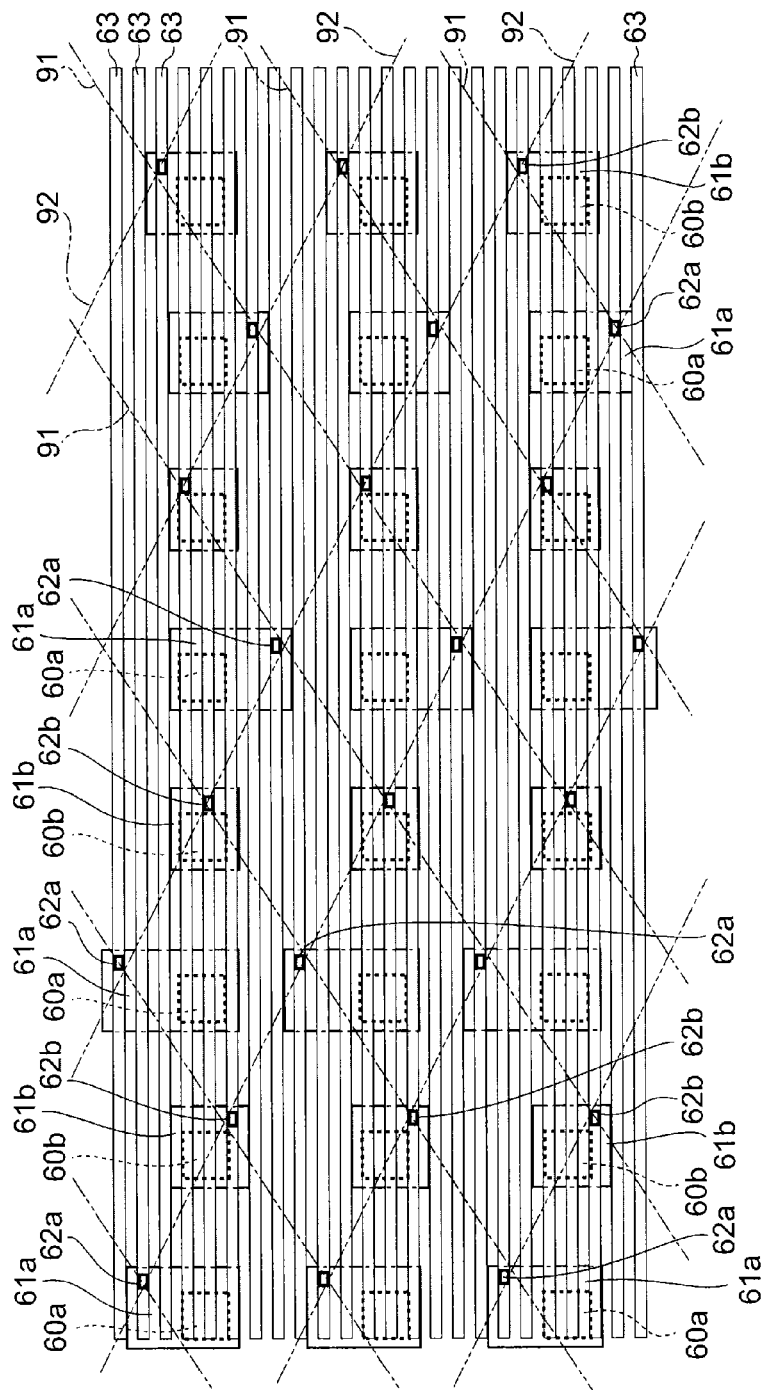
FIG. 9 is a top view showing the layout of a contact region according to a second embodiment.

As shown in FIG. 9, in a semiconductor memory device according to a second embodiment, four contacts 60a and four contacts 60b, or a total of eight contacts, are alternately arranged along the X direction. Three contacts 60a and three contacts 60b are arranged along the Y direction. In this case, the number of stacked word line conductive layers 43a-43d (see FIG. 3) may be 8 or 24.

The contact 60a is connected to a wiring 61a. The contact 60b is connected to a wiring 61b. As viewed from above (in the Z direction), the wiring 61a is shaped like a rectangle with the longitudinal direction directed in the Y direction. The wiring 61b is shaped like a rectangle with the longitudinal direction directed in the X direction. The wirings 61a and the wirings 61b are alternately arranged along the X direction.

The wiring 61a is connected to a contact 62a. The wiring 61b is connected to a contact 62b. The contacts 62a and 62b are alternately arranged along each of the W1 direction and the W2 direction, and arranged in a matrix as a whole. The W1 direction and the W2 direction are directions being parallel to the upper surface of the semiconductor substrate 40 (see FIG. 3), crossing both of the X direction and the Y direction, and crossing each other. The contacts 62a and 62b are placed at or near the cross-points of virtual straight lines 91 extending in the W1 direction and virtual straight lines 92 extending in the W2 direction.

A plurality of contacts 62a and a plurality of contacts 62b are connected to mutually different wirings 63. Thus, a first current path is formed in the order of the contact 60a, the wiring 61a, the contact 62a, and the wiring 63. A second current path is formed in the order of the contact 60b, the wiring 61b, the contact 62b, and the wiring 63. The first current path and the second current path are insulated from each other.

According to this embodiment, as in the above first embodiment, the rectangular wirings 61a with the longitudinal direction directed in the Y direction and the rectangular wirings 61b with the longitudinal direction directed in the X direction are alternately arranged along the X direction. Thus, while the wirings 61a and 61b are shaped like a rectangle, the contacts 62a and 62b can be arranged in a matrix near the cross-points of the straight lines 91 and the straight lines 92. This facilitates patterning of the wirings 61a and 61b and facilitates lithography for forming the contacts 62a and 62b. Furthermore, the wirings 61a and 61b can be densely arranged. Thus, the area of the contact region can be reduced.

The configuration, manufacturing method, and the effect of this embodiment other than the foregoing are similar to those of the above first embodiment.

3. Third Embodiment

Figure 10:
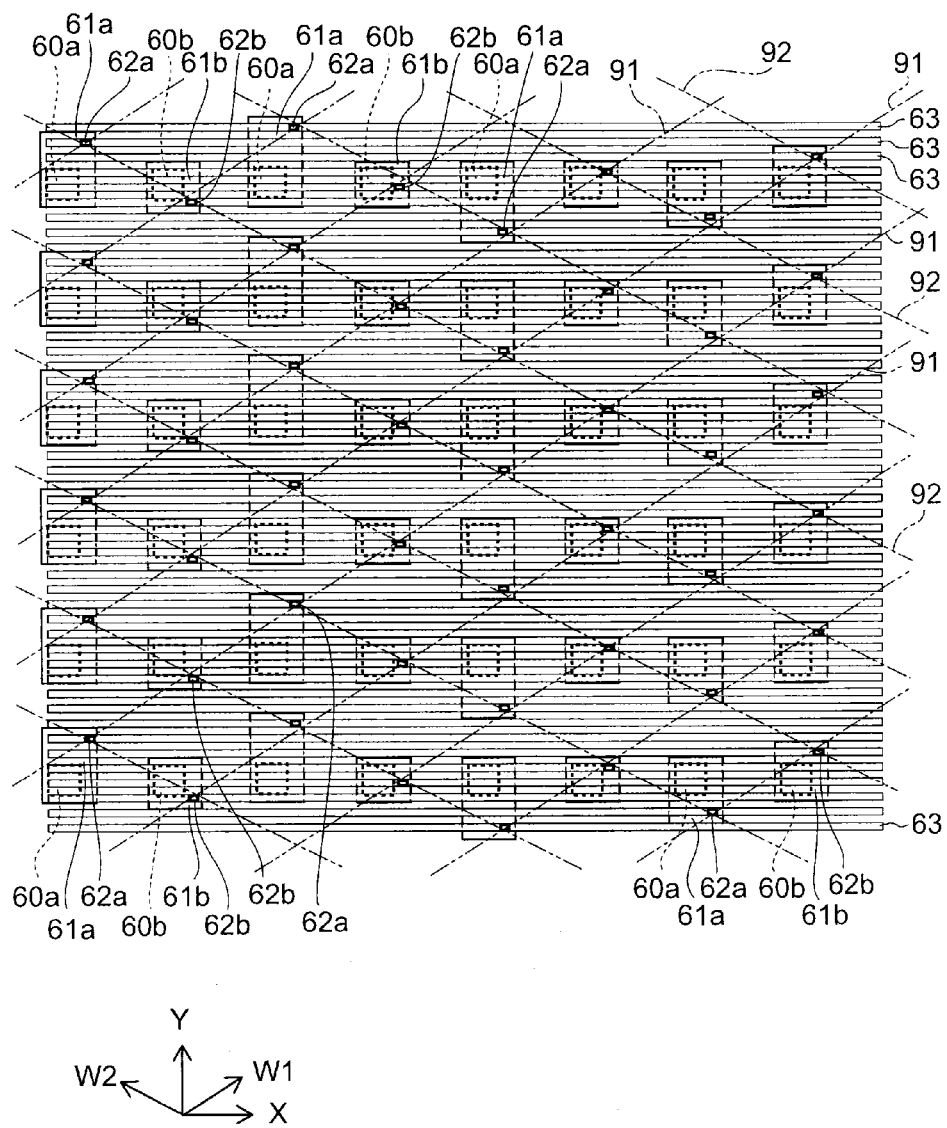
FIG. 10 is a top view showing the layout of a contact region according to a third embodiment.

As shown in FIG. 10, in a semiconductor memory device according to a third embodiment, four contacts 60a and four contacts 60b, or a total of eight contacts, are alternately arranged along the X direction. Six contacts 60a and six contacts 60b are arranged along the Y direction. In this case, the number of stacked word line conductive layers 43a-43d (see FIG. 3) may be 8 or 48.

The configuration, manufacturing method, and the effect of this embodiment other than the foregoing are similar to those of the above second embodiment.

4. Fourth Embodiment

Figure 11:
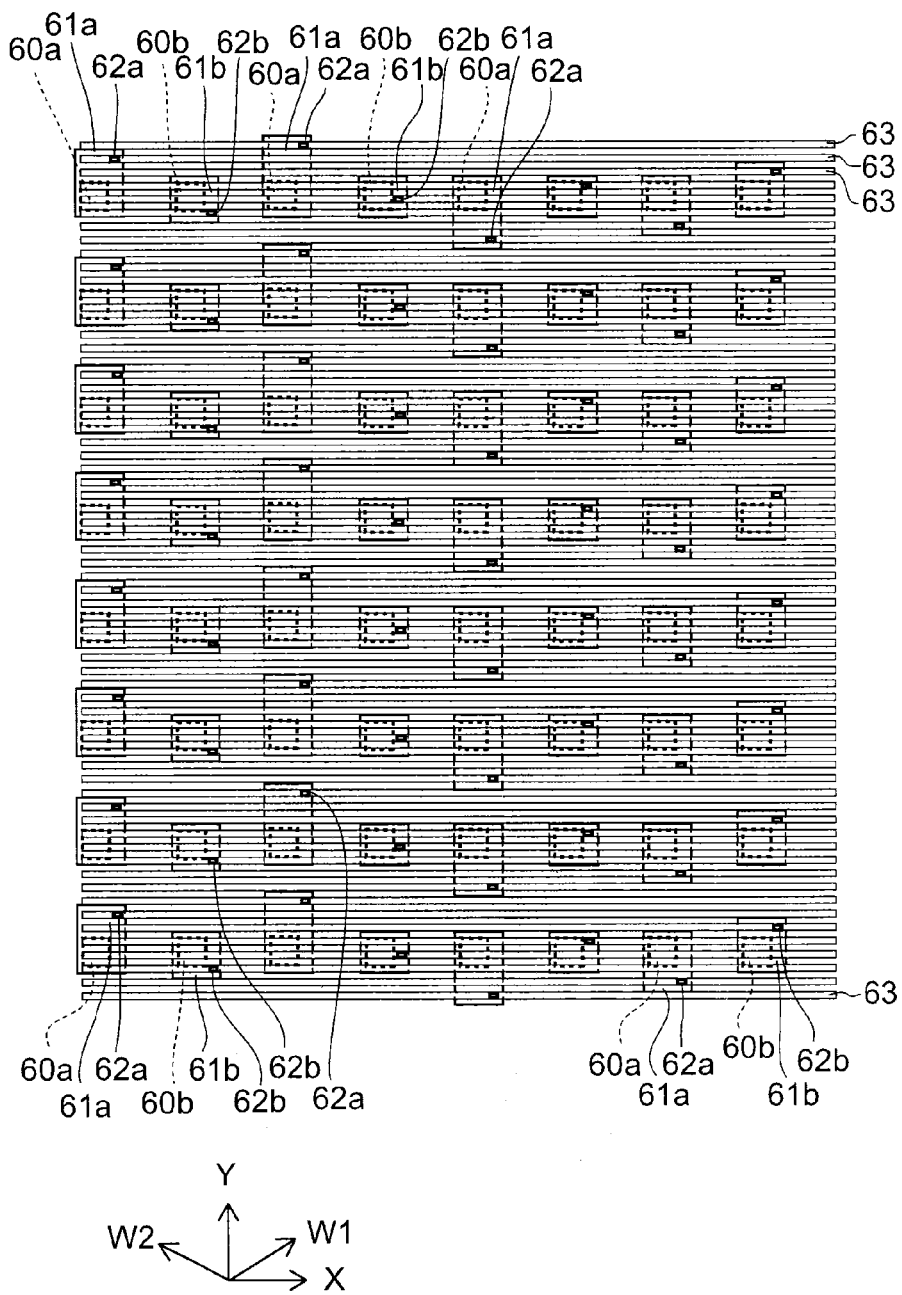
FIG. 11 is a top view showing the layout of a contact region according to a fourth embodiment.

As shown in FIG. 11, in a semiconductor memory device according to a fourth embodiment, four contacts 60a and four contacts 60b, or a total of eight contacts, are alternately arranged along the X direction. Eight contacts 60a and eight contacts 60b are arranged along the Y direction. In this case, the number of stacked word line conductive layers 43a-43d (see FIG. 3) may be 8 or 64.

The configuration, manufacturing method, and the effect of this embodiment other than the foregoing are similar to those of the above second embodiment.

5. Fifth Embodiment

Figure 12:
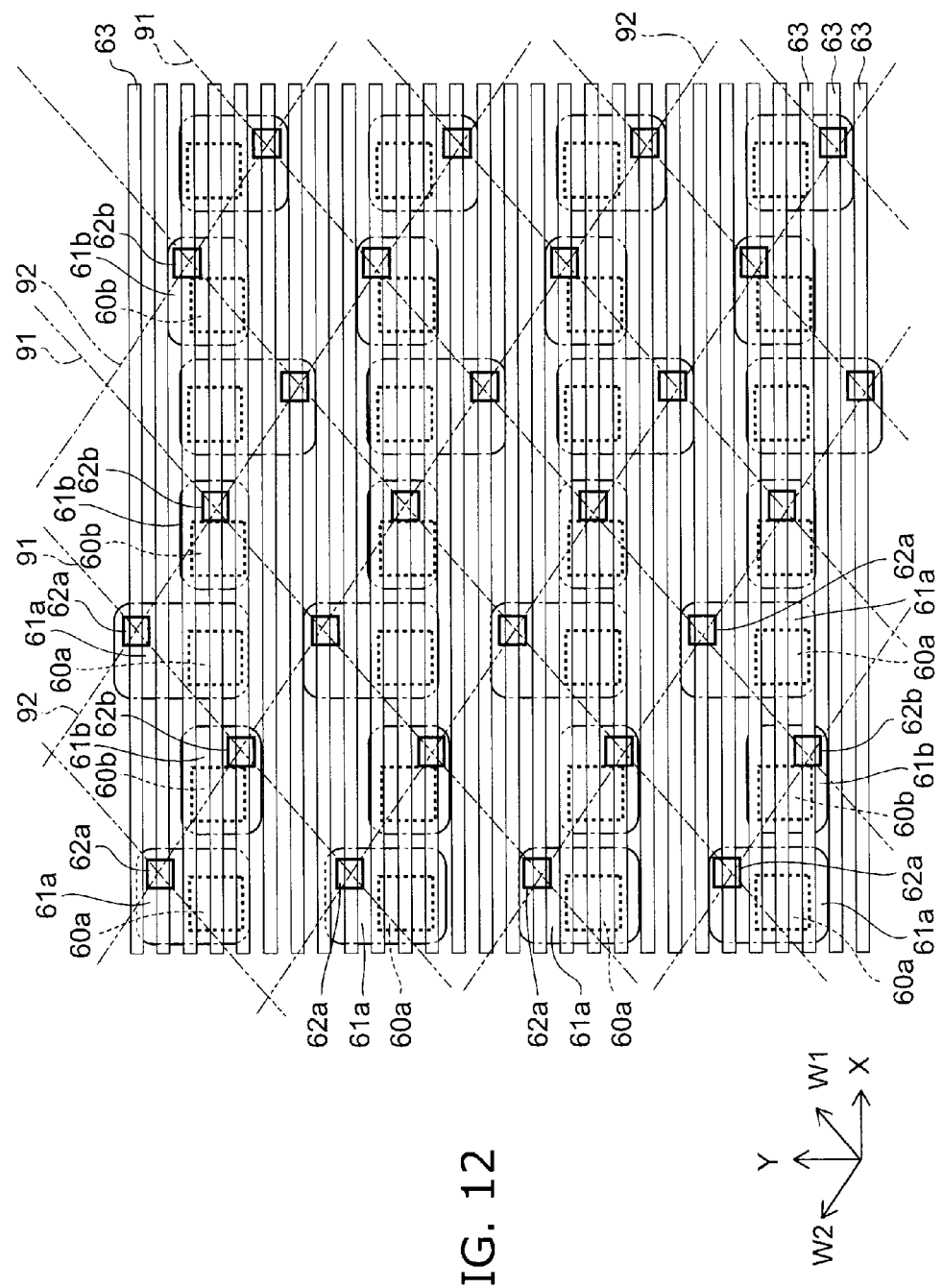
FIG. 12 is a top view showing the layout of a contact region according to a fifth embodiment.

As shown in FIG. 12, in a semiconductor memory device according to a fifth embodiment, four contacts 60a are arranged along the X direction. Three contacts 60b are arranged along the X direction. That is, the total number of contacts 60a and contacts 60b alternately arranged along the X direction in a line is odd. Of these contacts 60a and 60b, the number of contacts 60a is larger by one than the number of contacts 60b. Furthermore, four contacts 60a and four contacts 60b are arranged along the Y direction. In this case, the number of stacked word line conductive layers 43a-43d (see FIG. 3) may be 7 or 28.

In this embodiment, the number of contacts 60a and contacts 60b arranged along the X direction is odd. Thus, the arrangement position of the contacts 62a and 62b can be made closer to the cross-point of the wiring 91 and the wiring 92. This further facilitates lithography of the contacts 62a and 62b.

The configuration, manufacturing method, and the effect of this embodiment other than the foregoing are similar to those of the above second embodiment.

The embodiments described above can realize a semiconductor memory device capable of reducing the contact region.

Several embodiments of the invention have been described. However, these embodiments are presented by way of example, and are not intended to limit the scope of the invention. The embodiments have been described with reference to the example in which four word lines WL are stacked. However, the embodiments are not limited thereto, but the number of stacked word lines WL can be set to 8, 16, etc. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a semiconductor substrate;
    a memory cell array including a plurality of stacked memory cells;
    a plurality of first wirings electrically connected to the plurality of stacked memory cells;
    a plurality of first contacts electrically connected to part of the plurality of first wirings and arranged in a first direction parallel to the semiconductor substrate;
    a plurality of second contacts electrically connected to part of the plurality of first wirings and arranged in the first direction alternately with the plurality of first contacts;
    a plurality of third contacts electrically connected to the plurality of first contacts and displaced from the plurality of first contacts in the first direction;
    a plurality of fourth contacts electrically connected to the plurality of second contacts and displaced from the plurality of second contacts in a second direction perpendicular to the first direction;
    a third wiring connected between a first contact and a third contact and shaped like a rectangle with a longitudinal direction directed in the second direction; and
    a fourth wiring connected between a second contact and a fourth contact and shaped like a rectangle with a longitudinal direction directed in the first direction.

2. The device according to claim 1, wherein the plurality of third contacts and the plurality of fourth contacts are alternately arranged in the first direction and alternately arranged in the second direction.

3. The device according to claim 1, further comprising:
    a plurality of second wirings connected to the plurality of third contacts and the plurality of fourth contacts,
    wherein the plurality of second wirings are placed above the plurality of first wirings.

4. The device according to claim 1, wherein the plurality of first contacts and the plurality of second contacts are placed in a same insulating layer.

5. The device according to claim 1, wherein the plurality of third contacts and the plurality of fourth contacts are placed in a same insulating layer.

6. The device according to claim 1, wherein the plurality of third contacts and the plurality of fourth contacts are arranged in a matrix along a third direction and a fourth direction, the third direction being parallel to an upper surface of the semiconductor substrate and crossing both of the first direction and the second direction, and the fourth direction being parallel to the upper surface of the semiconductor substrate and crossing all of the first direction, the second direction, and the third direction.

7. The device according to claim 1, wherein a total number of the plurality of first contacts and the plurality of second contacts alternately arranged in the first direction is odd.

8. The device according to claim 1, wherein a total number of the plurality of first contacts and the plurality of second contacts alternately arranged in the first direction is even.

9. A semiconductor memory device comprising:
a semiconductor substrate;
a memory cell array including a plurality of stacked memory cells;
a plurality of first wirings electrically connected to the plurality of stacked memory cells;
a plurality of first contacts electrically connected to part of the plurality of first wirings and arranged in a first direction parallel to the semiconductor substrate;
a plurality of second contacts electrically connected to part of the plurality of first wirings and arranged in the first direction alternately with the plurality of first contacts;
a plurality of third contacts electrically connected to the plurality of first contacts and displaced from the plurality of first contacts in the first direction; and
a plurality of fourth contacts electrically connected to the plurality of second contacts and displaced from the plurality of second contacts in a second direction perpendicular to the first direction, wherein
the plurality of third contacts and the plurality of fourth contacts are arranged in a matrix along a third direction and a fourth direction, the third direction being parallel to an upper surface of the semiconductor substrate and crossing both of the first direction and the second direction, and the fourth direction being parallel to the upper surface of the semiconductor substrate and crossing all of the first direction, the second direction, and the third direction.

10. The device according to claim 9, wherein the plurality of third contacts and the plurality of fourth contacts are alternately arranged in the first direction and alternately arranged in the second direction.

11. The device according to claim 9, further comprising:
a plurality of second wirings connected to the plurality of third contacts and the plurality of fourth contacts, wherein
the plurality of second wirings are placed above the plurality of first wirings.

12. The device according to claim 9, wherein the plurality of first contacts and the plurality of second contacts are placed in a same insulating layer.

13. The device according to claim 9, wherein the plurality of third contacts and the plurality of fourth contacts are placed in a same insulating layer.

14. The device according to claim 9, wherein a total number of the plurality of first contacts and the plurality of second contacts alternately arranged in the first direction is odd.

15. The device according to claim 9, wherein a total number of the plurality of first contacts and the plurality of second contacts alternately arranged in the first direction is even.

* * * * *